(12) United States Patent
Quest-Matt et al.

(10) Patent No.: US 11,362,511 B2
(45) Date of Patent: Jun. 14, 2022

(54) ELECTRONIC UNIT HAVING AN ASSEMBLY FOR LIMITING CURRENT

(71) Applicant: CPT GROUP GMBH, Hannover (DE)

(72) Inventors: Christina Quest-Matt, Regensburg (DE); Detlev Bagung, Bernhardswald (DE); Thomas Riepl, Bad Abbach (DE)

(73) Assignee: Vitesco Technologies GmbH, Hannover (DE)

( * ) Notice: Subject to any disclaimer, the term of this patent is extended or adjusted under 35 U.S.C. 154(b) by 591 days.

(21) Appl. No.: 16/341,513

(22) PCT Filed: Sep. 6, 2017

(86) PCT No.: PCT/EP2017/072296
§ 371 (c)(1),
(2) Date: Apr. 12, 2019

(87) PCT Pub. No.: WO2018/068949
PCT Pub. Date: Apr. 19, 2018

(65) Prior Publication Data
US 2019/0372337 A1 Dec. 5, 2019

(30) Foreign Application Priority Data
Oct. 12, 2016 (DE) .......... 10 2016 219 771

(51) Int. Cl.
*H02H 9/02* (2006.01)
*H01H 85/048* (2006.01)
*H05K 1/02* (2006.01)

(52) U.S. Cl.
CPC ............ *H02H 9/02* (2013.01); *H01H 85/048* (2013.01); *H05K 1/0293* (2013.01); *H05K 2201/10181* (2013.01)

(58) Field of Classification Search
CPC ...... H02H 9/02; H01H 37/761; H01H 85/046; H01H 85/048; H01H 85/10;
(Continued)

(56) References Cited

U.S. PATENT DOCUMENTS 4,689,597 A 8/1987 Galloway et al.
6,002,564 A 12/1999 Ohtsuchi
(Continued)

FOREIGN PATENT DOCUMENTS

CN 2648588 Y 10/2004
CN 101567283 A 10/2009
(Continued)

OTHER PUBLICATIONS

Machine translation of Becker et al. International Patent Document WO 2008113343 A2 Sep. 25, 2008 (Year: 2008).*
(Continued)

*Primary Examiner* — Kevin J Comber
(74) *Attorney, Agent, or Firm* — Laurence A. Greenberg; Werner H. Stemer; Ralph E. Locher

(57) ABSTRACT

An electronic assembly, has at least one circuit board with conductor tracks, at least one current-limiting arrangement in the form of a thermal predetermined breaking point in at least one of the conductor tracks, and a fire-containment device in the region of the current-limiting arrangement.

11 Claims, 2 Drawing Sheets

(58) Field of Classification Search
CPC .. H01H 85/0013; H01H 85/11; H05K 1/0201; H05K 1/0293; H05K 2201/10181; H05K 2203/175
USPC .......................................................... 361/93.8
See application file for complete search history.

(56) References Cited

U.S. PATENT DOCUMENTS

| | | | |
|---|---|---|---|
| 8,614,898 | B2 | 12/2013 | Hiramatsu et al. |
| 2010/0164677 | A1 | 7/2010 | Yang |
| 2017/0290178 | A1* | 10/2017 | Albert .................. H05K 5/0043 |

FOREIGN PATENT DOCUMENTS

| | | | |
|---|---|---|---|
| CN | 102280326 A | | 12/2011 |
| CN | 204230191 U | | 3/2015 |
| DE | 3723832 A1 | | 2/1989 |
| DE | 102009046486 A1 | | 5/2011 |
| DE | 102010037390 A1 | | 3/2012 |
| EP | 1045625 A1 | | 10/2000 |
| JP | H03263726 A | | 11/1991 |
| JP | 2000285777 A | | 10/2000 |
| JP | 2005116487 A | * | 4/2005 |
| JP | 2005116487 A | | 4/2005 |
| WO | 2008113343 A2 | | 9/2008 |

OTHER PUBLICATIONS

Machine translation of Hakonen European Patent Document EP 1045625 A1 Oct. 18, 2000 (Year: 2000).*
Machine translation of Yoshikawa Japanese Patent Document JP 2000285777 A Oct. 13, 2000 (Year: 2000).*
Machine translation of Suzuki et al. Japanese Patent Document JP H03263726 A Nov. 25, 1991 (Year: 1991).*

* cited by examiner

ELECTRONIC UNIT HAVING AN ASSEMBLY FOR LIMITING CURRENT

BACKGROUND OF THE INVENTION

Field of the Invention

The present invention relates to an electronic assembly having at least one circuit board with conductor tracks and a current-limiting arrangement. It furthermore relates to the use of such an electronic assembly in a motor vehicle, and to a motor vehicle having the electronic assembly.

WO 2008/113343 A2 discloses an electronic assembly that has a conductor track fuse as current-limiting arrangement, wherein the conductor track fuse comprises a narrowing of the conductor track that has a smaller conductor cross section in comparison with other conductor tracks. If a fault current occurs for example in a component contacted by the conductor track, the current in the conductor track, but particularly at the narrowing, increases. The temperature at this narrowing thereby increases, and the conductor track fuse melts and thus breaks the current flow. Further problems, such as for example damage to adjacent components, are thereby avoided.

The problem is that current-limiting mechanisms are normally based on thermal processes. A temperature that is locally greatly increased in the region of the current-limiting arrangement may lead to inflammation of the circuit board and to the flames spreading into the surroundings.

SUMMARY OF THE INVENTION

One object of the present invention is therefore to specify an electronic assembly having a current-limiting arrangement that does not exhibit this disadvantage.

This object is achieved by the subject matter of the independent patent claim.

Advantageous refinements and developments of the invention may be gathered from the dependent claims, the following description and the drawings.

According to one aspect of the invention, an electronic assembly having at least one circuit board with conductor tracks is specified. The electronic assembly furthermore has at least one current-limiting arrangement in the form of a thermal predetermined breaking point in at least one conductor track. The electronic assembly additionally has a fire-containment device in the region of the current-limiting arrangement.

A thermal predetermined breaking point in a conductor track is understood here and hereinafter to mean a region of the conductor track that, in the event of increased thermal loading, that is to say in the event of thermal loading that significantly exceeds thermal loading occurring during normal operation of the electronic assembly, responds by interrupting the conductor track and therefore the current flow.

The current-limiting arrangement in the form of a thermal predetermined breaking point may in particular be a narrowing of the conductor track, that is to say a region of the conductor track having a reduced conductor track cross section.

It may also be a narrowing with a solder deposition arranged there above that melts in the event of increased thermal loading and brings about destruction of the conductor track. In the process, the material of the conductor track is in particular dissolved into the liquid solder to the extent that the conductor track is interrupted. Such a solder deposition may in particular be used together with a narrowing of the conductor track, the solder deposition preferably being arranged directly on or next to the narrowing, such that for example the temperature increase in the region of the narrowing brings about melting of the solder deposition. It is also conceivable for the solder deposition to be melted by way of a heating resistor of the current-limiting arrangement, the heating resistor being galvanically separated from the conductor track provided with the narrowing and being able to be formed for example by a further conductor track.

It may also be a current-limiting arrangement in which the conductor track is ruptured through thermal expansion and thus interrupted.

Fire-containment devices in the region of the current-limiting arrangement are understood here and hereinafter to mean devices that are suitable for limiting inflammation of elements of the electronic assembly to the region of the current-limiting arrangement, in particular to a closed spatial region, and/or for extinguishing the flames.

The circuit board may for example be formed from ceramic or from a plastic or resin, and the conductor tracks may for example be formed from copper. In principle, the electronic assembly according to the invention may comprise any conventional type of circuit board.

The electronic assembly has the advantage that the fire-containment device provided in the region of the current-limiting arrangement is able to prevent inflammation of the circuit board or is able to extinguish existing flames. A fire is thereby locally greatly contained and is not able to spread to further regions of the electronic assembly or to the surroundings of the electronic assembly. This also has the effect that the current-limiting arrangement no longer constitutes a safety risk when using the electronic assembly.

According to one embodiment, the fire-containment device has an airtight hood or consists thereof. The airtight hood is applied above the current-limiting arrangement and encloses the surroundings of the current-limiting arrangement in an airtight manner. In other words, an edge of the hood that is connected to the circuit board—in particular in an airtight manner—runs completely around the current-limiting arrangement, in particular in a plan view of a plane of main extent of the circuit board.

According to one embodiment, the hood is designed as a metal hood.

In this embodiment, the airtight or substantially airtight metal hood firstly locally contains a fire and secondly cuts off the oxygen supply, by virtue of which the fire is extinguished when the oxygen present underneath the metal hood has been consumed.

This spatial containment of the flames is advantageous in particular in the case of plastic housings, since, in the case thereof, spreading of the flames to other combustible materials should be prevented.

The metal hood may be designed in one piece and be preformed for example by punching and/or deep drawing or another suitable process.

The metal hood may be soldered or adhesively bonded to the circuit board or form-fittingly or frictionally connected to the circuit board, for example by crimping or pressing and/or by using press-fit pins.

In one embodiment, the electronic assembly has a housing in which in particular the circuit board is arranged. In this case, the fire-containment device may have an airtight hood whose cover is formed by a region of a housing of the electronic assembly and whose sidewalls are formed at least partly by a sealing material applied to the circuit board and surrounding the current-limiting arrangement, such that the hood encloses the surroundings of the current-limiting arrangement in an airtight manner.

In this embodiment, an existing housing of the electronic assembly is used to form parts of the airtight hood. In particular, the cover of the hood is formed by a region of the housing, but sidewalls—or parts thereof—may also be formed by housing parts. The other sidewalls or sidewall parts are formed by the sealing material. The sealing material may in particular be a thermally conductive material.

A thermally conductive material is understood here and hereinafter to mean a material that is also known as a thermal interface material (T.I.M. or "TIM") and that is used to improve thermal conduction between components.

Such material is in principle known to those skilled in the art. It is also used in any case as a sealing material in electronic assemblies. Since it is easy to apply, it is advantageously able to be used to form sidewalls of the airtight hood. To this end, the thermally conductive material is applied around the current-limiting arrangement to a thickness sufficient to be able to form sidewalls of the airtight hood. Advantageously, the current-limiting arrangement itself is kept free from thermally conductive material so as not to impair its functionality.

This embodiment as well has the advantage that, in the event of inflammation, the fire is locally greatly contained and, furthermore, the flames are extinguished due to the greatly limited oxygen supply.

As an alternative or in addition, the fire-containment device may have a flame-retardant material that is arranged adjacent to the current-limiting arrangement. Such a flame-retardant material may either be embodied as a deposition of the material, applied in a targeted manner, or be placed, in the form of an electronic component having flame-retardant properties for fire-extinguishing purposes, adjacent to the current-limiting arrangement.

According to a further aspect, the described electronic assembly is used in a motor vehicle, for example in an engine controller of a motor vehicle. According to further aspects, a motor vehicle having the electronic assembly and an electronic controller for a motor vehicle, in particular an engine controller, having the electronic assembly are specified. The abovementioned housing of the assembly is in particular the housing of the electronic controller.

Since stringent fire protection rules apply to motor vehicles, the electronic assembly according to the invention is particularly suitable for use in a motor vehicle due to its greatly reduced risk of inflammation.

BRIEF DESCRIPTION OF THE SEVERAL VIEWS OF THE DRAWING

Exemplary embodiments are explained in more detail below with reference to figures. In the figures.

DESCRIPTION OF THE INVENTION

Figure 1:
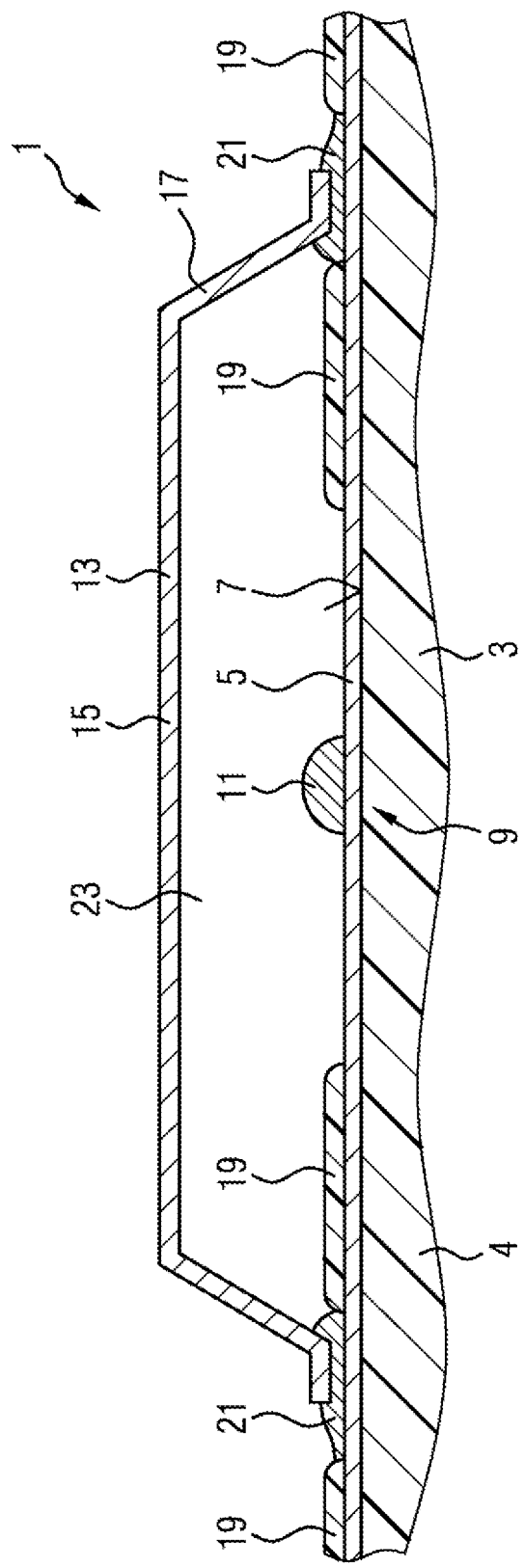
FIG. 1 schematically shows a cross section through an electronic assembly according to a first embodiment of the invention.

The electronic assembly 1 according to FIG. 1 contains a circuit board 3 having a substrate 4, on the upper side 7 of which conductor tracks 5 made of copper are arranged. The conductor track 5 that is shown may for example make contact with an electronic component, not shown.

A current-limiting arrangement 9, which is designed as a narrowing of the conductor track 5, is provided in the conductor track 5. The narrowing, which is also called a "dogbone" by those skilled in the art due to its shape, is able to be seen particularly well in the view according to FIG. 2.

The current-limiting arrangement 9 furthermore comprises a solder deposition 11. If a greatly increased current flows through the conductor track 5, the temperature of the conductor track 5 increases, in particular in the region of the current-limiting arrangement 9, and does so there due to the reduced conductor track cross section. The solder deposition 11 therefore melts and copper of the conductor track 5 is dissolved into the solder material. This results in destruction of the conductor track 5. The current is interrupted.

Due to the high temperatures occurring in this procedure, there may be local inflammation of the circuit board 3. To contain such a fire, the electronic assembly 1 according to FIG. 1 has an airtight hood 13 above the current-limiting arrangement 9. The airtight hood 13 has a cover 15 and sidewalls 17 made of metal. In the embodiment that is shown, it is produced in one piece—that is to say formed from a single blank and not put together from several parts during manufacture thereof—and is soldered onto the circuit board 3. In this case, a layer of solder resist 19 contains the solder 21.

In the event of inflammation of the circuit board 3 in the region of the current-limiting arrangement 9, the fire is contained to the interior 23 of the metal hood 13 by the metal hood 13. The fire is additionally extinguished by limiting the oxygen supply.

Figure 2:
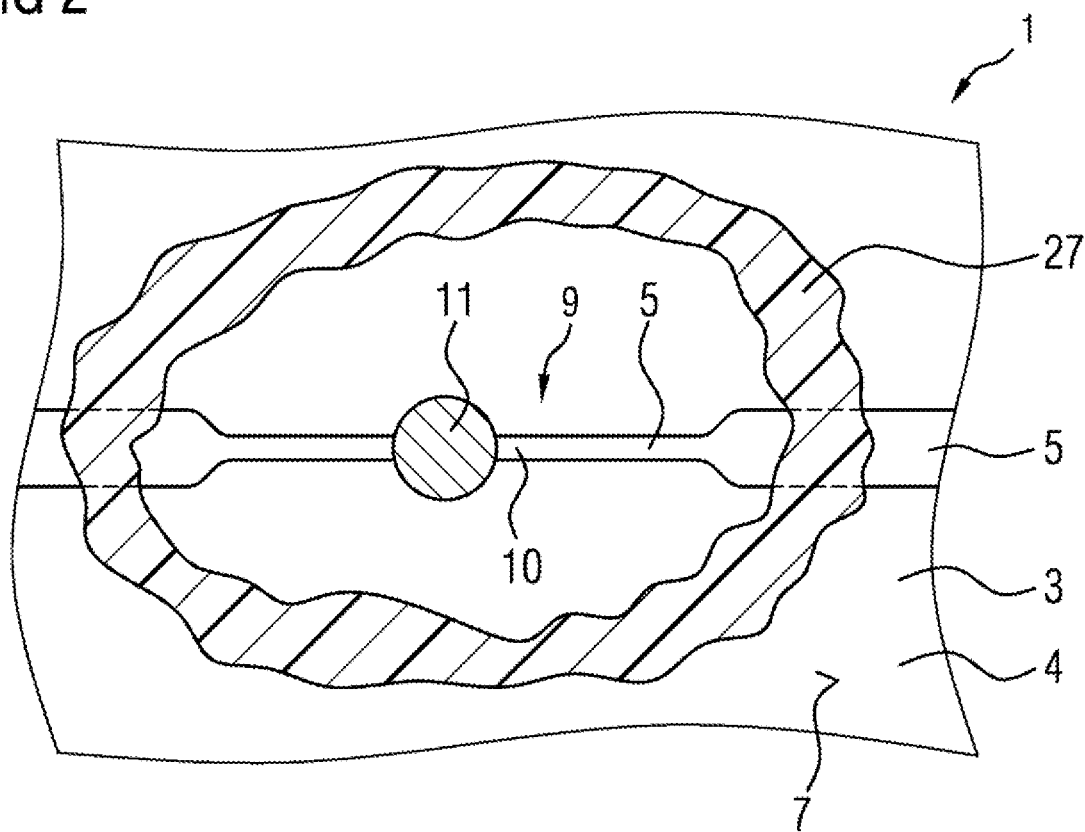
FIG. 2 shows a partial sectional view of an electronic assembly according to a second embodiment of the invention.

FIG. 2 shows a second embodiment of the electronic assembly 1. In the partial sectional view that is shown, it is possible to see the narrowing 10 of the conductor tracks 5 in the region of the current-limiting arrangement 9.

Figure 3:
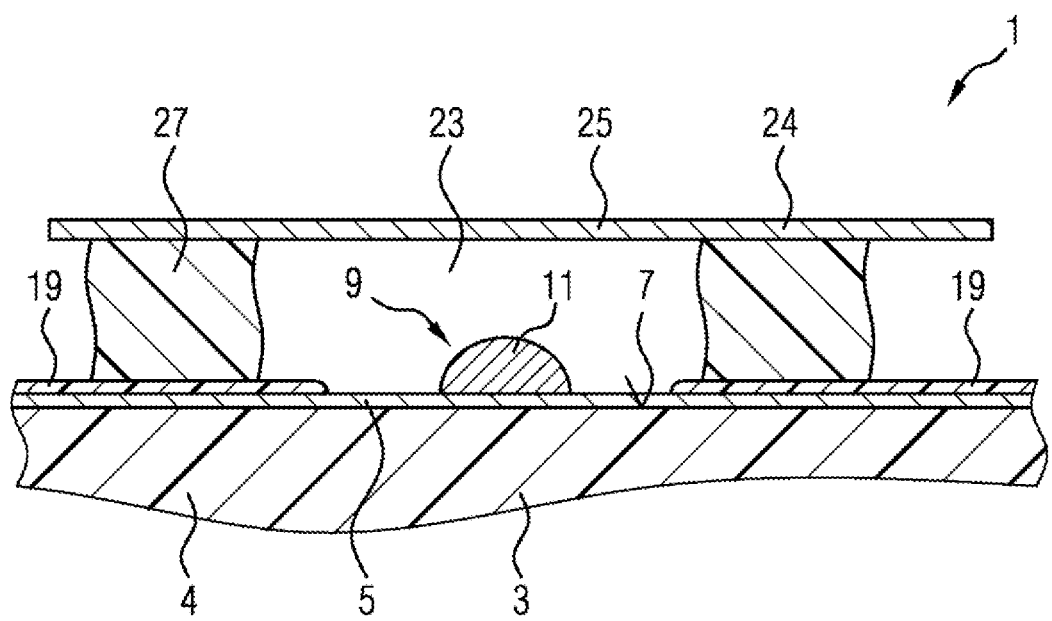
FIG. 3 shows a cross section through the electronic assembly according to FIG. 2.

The second embodiment differs from the first embodiment shown in FIG. 1 in that an airtight metal hood is not provided as fire-containment device, but rather an airtight hood 24 is formed by a cover 25, shown in FIG. 3, and sidewalls 27 made of a thermally conductive material.

In this case, the cover 25 is formed by a region, which is present in any case, of a housing of the electronic assembly 1, for example made of metal.

The sidewalls 27 are formed from a thermally conductive material that is also used as sealing material within the electronic assembly and that is applied for example by dispensing—that is to say for example applying a bead of liquid sealing material by way of a nozzle. To form the sidewalls 27, the thermally conductive material is applied around the current-limiting arrangement 9 to the upper side 7 of the substrate 4 or to the conductive track 5. The current-limiting arrangement 9 remains free from the thermally conductive material.

In the assembly process, the housing of the electronic assembly 1 is then placed, as a result of which the cover 25 of the airtight hood 24 is placed onto the sidewalls 27. The application thickness of the thermally conductive material applied for the sidewalls 27 is selected such that the sidewalls 27 tightly adjoin the cover 25.

The invention claimed is:

1. An electronic assembly, comprising:
   at least one circuit board formed with conductor tracks;
   at least one current-limiting arrangement being a thermal predetermined breaking point in at least one of said conductor tracks; and a fire-containment device at said current-limiting arrangement;

said fire-containment device including an airtight metal hood disposed above said current-limiting arrangement and enclosing a surroundings of said current-limiting arrangement in an airtight manner.

2. The electronic assembly according to claim 1, wherein said metal hood is soldered onto said circuit board.

3. The electronic assembly according to claim 1, wherein said metal hood is adhesively bonded to said circuit board.

4. The electronic assembly according to claim 1, wherein said metal hood is form-fittingly or frictionally connected to said circuit board.

5. The electronic assembly according to claim 1, which further comprises a housing and wherein said airtight hood has a cover formed by a portion of said housing, wherein said hood has sidewalls formed at least partly by a sealing material applied to said circuit board and surrounding said current-limiting arrangement, such that said hood encloses the surroundings of said current-limiting arrangement in an airtight manner.

6. The electronic assembly according to claim 5, wherein said sealing material is a thermally conductive material.

7. The electronic assembly according to claim 1, wherein said fire-containment device has a flame-retardant material arranged adjacent said current-limiting arrangement.

8. The electronic assembly according to claim 1, wherein said fire-containment device includes a flame-retardant material arranged adjacent said current-limiting arrangement.

9. A motor vehicle, comprising the electronic assembly according to claim 1.

10. The electronic assembly according to claim 1, further comprising an electronic component contacting the at least one of said conductor tracks with the at least one current-limiting arrangement.

11. The electronic assembly according to claim 10, wherein said electronic component is disposed on said at least one circuit board.

* * * * *